United States Patent [19]
Koifman et al.

[11] Patent Number: 5,939,906
[45] Date of Patent: Aug. 17, 1999

[54] CIRCUIT COMPENSATING NONLINEARITIES

[75] Inventors: Vladimir Koifman, Rishon-Lezion; Yachin Afek, Kfar Saba; Eliezer Sand, Hod Hasharon, all of Israel

[73] Assignee: Motorola, Inc., Schaumburg, Ill.

[21] Appl. No.: 08/925,161

[22] Filed: Sep. 8, 1997

[51] Int. Cl.$^6$ .................................................. H02M 11/00
[52] U.S. Cl. ............................ 327/103; 327/65; 327/359
[58] Field of Search .................................... 327/103, 355, 327/356, 359, 65, 66, 89, 379, 389, 391

[56] References Cited

U.S. PATENT DOCUMENTS

| | | | |
|---|---|---|---|
| 5,587,682 | 12/1996 | Colli et al. .............................. | 327/359 |
| 5,712,810 | 1/1998 | Kimura .................................. | 327/359 |
| 5,726,592 | 3/1998 | Schulte et al. ......................... | 327/65 |

OTHER PUBLICATIONS

Babanezhad, J. N., Temes G. C.: "A 20 V four quadrant CMOS analog multiplier", IEEE Journal of Solid State Circuits, vol. SC–20, pp. 1158–1168, Dec. 1985.

Ismail, M., Fiez, T.: "Analog VLSI Signal and Information Processing", chapter 3.3, McGraw–Hill, 1994, ISBN 0–07–032386–0; pp. 63–72.

Franca, J. E.: "Design of Analog–Digital VLSI Circuits for Telecommunications and Signal Processing", chapter 3.5 (pp. 81–96), Second Edition, Prentice Hall, Englewood Cliffs, 1994, ISBN 0–13–203639–8.

Silva–Martinez, J.: "High–Performance CMOS Continuous–Time Filters", Kluwer Academic Publishers, 1993, ISBN 0–7923–9339–2, chapter 2, pp. 15–66.

*Primary Examiner*—Kenneth B. Wells

[57] ABSTRACT

In a circuit (200), a differential pair (217/227) of transistors (210 and 220) receives a differential input signal ($X_1-X_2$) from input terminals (211 and 221) and provides a differential output signal ($Y_1-Y_2$) to output lines (215 and 225). The differential pair (217/227) is powered from a common constant current source (290) at a common node (205). Nonlinearities, such as cubic terms in a transfer function $H=(Y_1-Y_2)/(X_1-X_2)$ caused by the transistors are compensated by compensation circuits (237 and 247). The compensation circuits (237 and 247) are coupled between the node (205) and the output lines (215 and 225). The compensation circuits (237 and 247) are controlled by the input signal ($X_1-X_2$) and drain current from the node (205). Thereby, the currents going into the transistors (210 and 220) and the transistors gains ($Y_1/X_1$ and $Y_2/X_2$) are modified, so that nonlinearities are substantially canceled.

18 Claims, 4 Drawing Sheets

CIRCUIT COMPENSATING NONLINEARITIES

RELATED APPLICATION

The present application is related to the commonly assigned United States application "Linear Voltage-to-current converter" by Koifman et. al., having Ser. No. 08/695,929, filed on Dec. 8, 1996, which is incorporated herein by reference.

FIELD OF THE INVENTION

The present invention generally relates to electronic circuits, and, more particularly to voltage-to-current converters in which nonlinearities of their elements are compensated.

BACKGROUND OF THE INVENTION

Differential converters receiving a differential input signal X and providing a differential output signal Y are widely used in many devices. For example, voltage-to-current converters (VICs) are part of continuous-time analog-to-digital converters (ADC), filters, and other devices. Compared to voltages, currents are less sensitive to digital noise originating from a microchip substrate or from supply lines. In an environment where digital circuits and analog circuits are placed together on a single chip, processing signal currents by e.g., filtering, sampling, scaling, or the like, is more desirable than processing signal voltages. VICs are therefore very useful for modern circuit design.

Usually, VICs comprise differential transistor pairs and compensation circuits. For the application of VICs and for prior art designs, the following references are useful:

[2] Babanezhad, J. N., Temes G.C.: "A 20 V four quadrant CMOS analog multiplier", IEEE Journal of Solid State Circuits, volume SC-20, pages 1158–1168, December 1985;

[3] Ismail, M., Fiez, T.: "Analog VLSI Signal and Information Processing", chapter 3.3, McGraw-Hill, 1994, ISBN 0-07-032386-0;

[4] Silva-Martinez, J.: "High-Performance CMOS Continuous-Time Filters", chapter 2, Kluwer Academic Publishers, 1993, ISBN 0-7923-9339-2; and

[5] Franca, J. E.: "Design of Analog-Digital VLSI Circuits for Telecommunications and Signal Processing", chapter 3.5 (pages 81–96), Second Edition, Prentice Hall, Englewood Cliffs, 1994, ISBN 0-13-203639-8.

The properties of the VIC influence the overall performance of the devices. The transfer function of the VIC, and in general that of any circuit, is limited by intrinsic nonlinearities of its elements. Especially, transistors have nonlinear transfer functions. The X-Y-transfer function between the input signal X and the output signal Y of a converter is generally not linear. The X-Y-transfer function can be expressed by a polynomial:

$$Y = k_1 * X + k_2 * X^2 + k_3 * X^3 + \ldots$$

where the symbol * indicates multiplication. A simple sinusoidal input signal X having the frequency $f_1$ is transformed into an output signal Y having the fundamental frequency $f_1$ and harmonics, such as $f_3 = 3*f_1$ or other harmonics. The higher frequency parts ($f_2, f_3, \ldots$) of Y contribute to the Total Harmonic Distortion (THD). An input signal X having multiple frequencies is transferred into an output signal Y containing also sum and difference frequencies. That can lead to intermodulation distortions.

Relations between the magnitude of input signals X and supply voltages $V_s$ of circuits are well known. For example, input signal X oscillating with amplitudes $|X| << V_s$ causes less distortion than when signal is in the range of $V_s$, i.e. $|X| \approx V_s$. Amplifying elements, such as vacuum tubes, bipolar transistors, field effect transistors and other devices can operate sometimes in such $V_s$ regions where nonlinearities can be neglected. However, the trend in modern electronics is to use smaller and smaller supply voltages $V_s$. Therefore, nonlinearities will occur and need to be compensated.

It is known in the art to compensate nonlinearities by, for example: (a) chaining differential transistor pairs in the VIC; (b) changing the bias for transistors depending on the input signal X; or (c) subtracting a compensation signal from output signal Y. In an example of (a), FIG. 2.2a in chapter 2.2. of [4] illustrates a converter with four transistors. In an example of (b), FIG. 25 in chapter 3.5.1 of [5] illustrates an amplifier employing a so-called adaptive biasing technique. In the approach (c) which has been disclosed with details in FIG. 3 of [1], transistors 110 and 120 each receive a component of X (e.g., $V_1$ and $V_2$) and provide currents (e.g., $I_1$ and $I_2$). Currents $I_1$ and $I_2$ are still distorted and are linearized by subtracting current $I_3$ and $I_4$, resulting in output signal Y. However, currents $I_3$ and $I_4$ also contain the input signal X.

These prior art circuits can suffer from disadvantages well known in the art, such as for example, low gain, low signal-to-noise ratio (SNR), high power consumption and other problems. Hence, the present invention seeks to provide voltage-to-current converters (VICs) which mitigate or avoid some or all of these and other disadvantages and limitations of the prior art.

DETAILED DESCRIPTION OF A PREFERRED EMBODIMENT

A linear voltage-to-current converter circuit (VIC) of the present invention has a series of advantages: (a) high speed operation; (b) high SNR; and (c) high efficiency while transforming substantially all supply current to output signal Y.

As in the prior art, the VIC of the present invention comprises a differential transistor pair ($M_1$ and $M_2$) receiving input signal X (e.g., $V_{in\ 1} - V_{in\ 2}$) and providing output signal Y (e.g., $I_{out\ 1} - I_{out\ 2}$). In comparison to the prior art, the VIC of the present invention has a compensation portion which changes the supply current of the transistors pair ($M_1$ and $M_2$) so that nonlinearities are not amplified.

Figure 1:
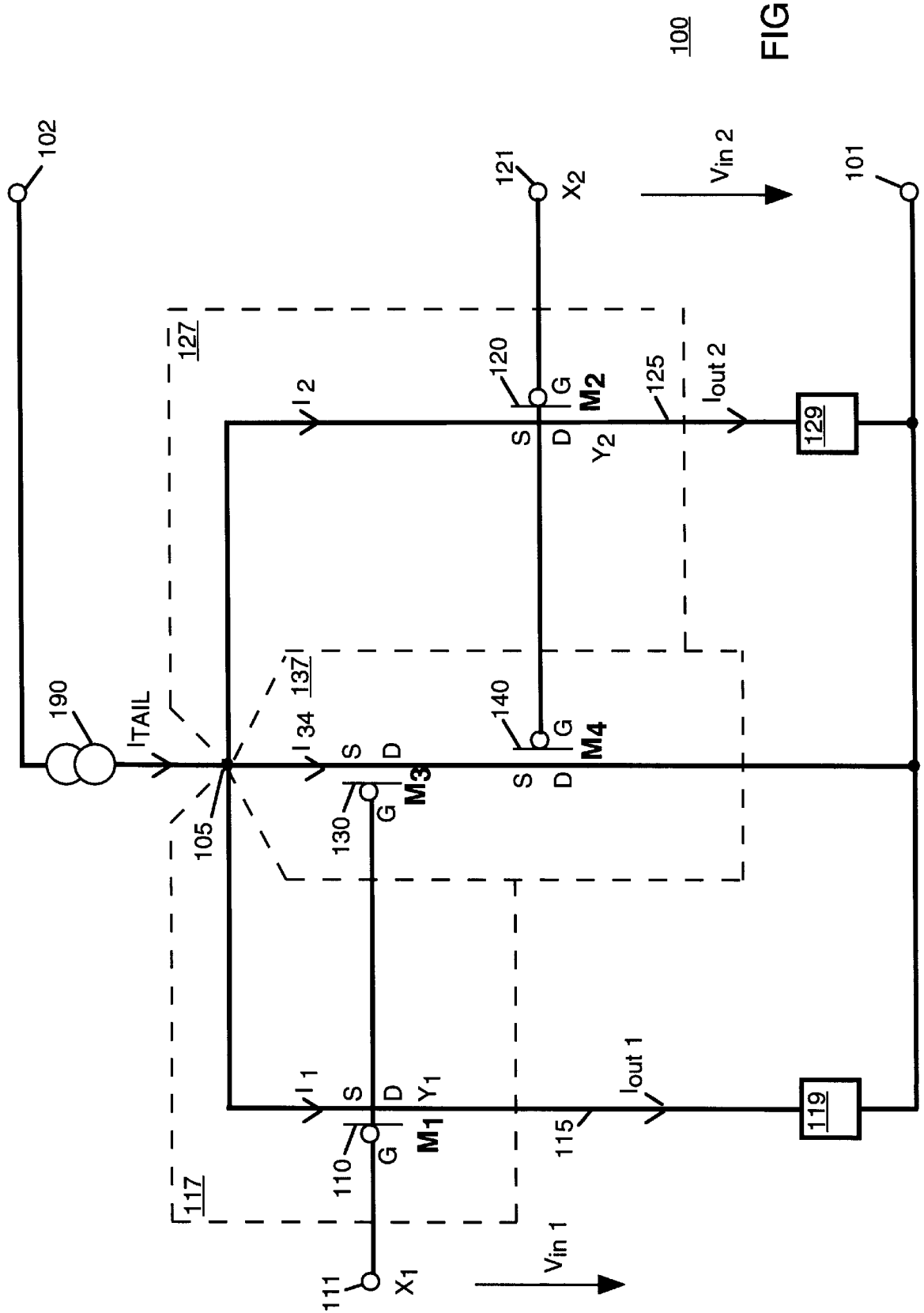
FIG. 1 is a simplified circuit diagram of a voltage-to-current converter circuit (VIC) of the present invention.

FIG. 1 shows voltage-to-current converter circuit 100 (VIC 100) according to the present invention. VIC 100 comprises first amplifying element 110 (hereinafter transistor $M_1$), second amplifying element 120 ("transistor $M_2$"), third amplifying element 130 ("transistor $M_3$"), fourth amplifying element 140 ("transistor $M_4$"), node 105, and current source 190. Transistors $M_1$ and $M_2$ form differential pair 117/127 with paths 117 and 127. Paths 117 and 127 are shown by dashed frames. Transistors $M_3$ and $M_4$ form compensation circuit 137. Circuit 137 is also referred to as path 137 and also shown by a dashed frame.

The word "transistor" used here as a synonym for "amplifying element" is intended to include any device having main electrodes and one or more control electrodes. Signals applied to the control electrode(s) change the electrical properties (e.g., conductance) between the main electrodes. Transistors such as $M_1$, $M_2$, $M_3$, and $M_4$ (collectively $M_k$) can be e.g., field effect transistors (FETs) having drain (D), source (S) as main electrodes and gates (G) as control electrode. Transistors can also be bipolar transistors with collectors (C) and emitters (E) as main electrodes and bases (B) as control electrodes, or other devices. Transistors $M_k$ are, preferably, field effect transistors (FETs) of the p-channel type (symbolized by circles at the gates). This is convenient for explanation, but not essential. FETs of the n-channel type or both n-channel and p-channel types can also be used.

As illustrated in FIG. 1, VIC 100 is conveniently coupled to power supply at reference terminals 101 and 102. Either terminal can serve as the power supply or as reference. VIC 100 receives differential input signal $X=X_1-X_2$ at input terminals 111 and 121, respectively. Preferably, input signal X is a differential voltage ($V_{in\ 1}-V_{in\ 2}$) with components $V_{in\ 1}$ (as $X_1$ at terminal 111) and $V_{in\ 2}$ (as $X_2$ at terminal 121). $V_{in\ 1}$ and $V_{in\ 2}$ are conveniently referred to terminal 101. VIC 100 provides differential output signal $Y=Y_1-Y_2$ on lines 115 and 125, respectively. Preferably, output signal Y is a differential output current ($I_{out\ 1}-I_{out\ 2}$) with components $I_{out\ 1}$ (as $Y_1$ on line 115) and $I_{out\ 2}$ (as $Y_2$ on line 125) flowing through loads 119 and 129, respectively, to reference terminal 101.

Current source 190 is coupled between reference terminal 102 and node 105. Node 105 is coupled in first path 117 to the source S of transistor $M_1$, whose drain D is coupled to line 115. Node 105 is coupled in second path 127 to the source S of transistor $M_2$, whose drain D is coupled to line 125. Node 105 is coupled in third path 137 to the source S of transistor $M_3$. Further in path 137, the drain D of transistor $M_3$ is coupled to the source S of transistor $M_4$; and the drain D of transistor $M_4$ is, conveniently, coupled to reference terminal 101. Input terminal 111 is coupled to the gate G of transistor $M_1$ in path 117 and to the gate G of transistor $M_3$ in path 137. Input terminal 121 is coupled to the gate G of transistor $M_2$ in path 127 and to the gate G of transistor $M_4$ in path 137.

Current source 190 is a common supply and provides a substantially constant tail current $I_{TAIL}$. At node 105, $I_{TAIL}$ is split into currents $I_1$ (path 117), $I_2$ (path 127), and $I_{34}$ (path 137):

$$I_{TAIL}=I_1+I_2+I_{34} \approx \text{constant} \tag{1}$$

Input signal $X_1$ (e.g., $V_{in\ 1}$) at gate G of transistor $M_1$ modulates $I_1$ so that output signal $Y_1$ (e.g., current $I_{out\ 1}$) is provided at drain D of transistor $M_1$. Input signal $X_2$ (e.g., $V_{in\ 2}$) at the G of transistor $M_2$ modulates $I_2$ so that output signal $Y_2$ (e.g., current $I_{out\ 2}$) is provided at drain D of transistor $M_2$. With the condition (1) supported by current source 190, $I_{34}$ acts as a compensation current and changes $I_1+I_2$ depending on input signals $X_1$ and $X_2$. The amplification, that means the gain ratios ($Y_1/X_1$) of transistor $M_1$ and ($Y_2/X_2$) of transistor $M_2$ depend on $I_1$ and $I_2$, respectively. When signals $X_1$ and $X_2$ change, currents $I_1$ and $I_2$ also change. Nonlinearities of transistors $M_1$ and $M_2$ can thereby be compensated.

It is convenient for more detailed explanation to discuss a transfer function H of VIC 100:

$$H=Y/X \text{ or} \tag{2}$$

$$H=(Y_1-Y_2)/(X_1-X_2), \tag{3}$$

with the slash / for division. This transfer function is substantially linearized according to the present invention. $Y_1$ and $Y_2$ should depend on $X_1$ and $X_2$ and on $I_1$ and $I_2$ as follows:

$$Y_1=H_{11}*X_1+H_{21}*X_1^3+H_{31}*I_1 \tag{4}$$

$$Y_2=H_{12}*X_2+H_{22}*X_2^3+H_{32}*I_2 \tag{5}$$

with * for multiplication and with parameters $H_{1k}$ depending on transistors $M_k$. In parameters $H_{1k}$, the first index 1=1, 2, 3 refers to similar terms (or "components") in equations (4) and (5) and the second index k=1, 2 refers to transistors $M_k$. $H_{1k}$ are parameters for the linear transistor characteristic of transistor $M_k$; $H_{2k}$ are parameters for the nonlinear transistor characteristic of transistor $M_k$; and $H_{3k}$ are parameters for the influence of the magnitude of $I_k$ on transistor $M_k$.

The cubic terms $H_{21}*X_1^3$ and $H_{22}*X_2^3$ are used as a simplified representation which is intended to include other nonlinear terms, such as square terms. A person of skill in the art, is able to apply a series as, for example, in the form $$y=h_0+h_1*x+h_2*x^2+h_3*x^3+h_4*x^4+\ldots h_n*x^n \tag{6}$$

to all terms in equations (4), (5) and in other, similar equations. $Y=(Y_1-Y_2)$ is calculated by subtracting equation (5) from equation (4):

$$\begin{aligned} Y_1-Y_2 =\ & (H_{11}*X_1-H_{12}*X_2) && \text{[linear as required]} \\ & +(H_{21}*X_1^3-H_{22}*X_2^3) && \text{[nonlinear and to be canceled]} \\ & +(H_{31}*I_1-H_{32}*I_2) && \text{[constant if } I_1 \text{ and } I_2 \text{ constant]} \end{aligned} \tag{7}$$

It has been found that for certain magnitudes of currents $I_1$ and $I_2$, the second term $(H_{21}*X_1^3-H_{22}*X_2^3)$ of equation (7) is substantially equal to the third term $(H_{31}*I_1-H_{32}*I_2)$ of equation (7):

$$(H_{21}*X_1^3-H_{22}*X_2^3) \approx (H_{31}*I_1-H_{32}*I_2) \tag{8}$$

so that nonlinearities can be substantially canceled:

$$Y_1-Y_2=(H_{11}*X_1-H_{12}*X_2) \tag{9}$$

which is substantially the linear first term in equation (7) as required. In VIC 100 as described in FIG. 1, $H_{31}$ and $H_{32}$ are parameters depending on transistors $M_1$ and $M_2$, respectively. Compensation current $I_{34}$ in the third path depends on input signals $X_1$ and $X_2$ according to:

$$I_{34}=H_{13}*X_1+H_{14}*X_2 \tag{10}$$

with $H_{13}$ and $H_{14}$ being parameters of transistors $M_3$ and $M_4$. Transistor parameters $H_{13}$ and $H_{14}$ are, preferably, predetermined. Due to the connection of paths 117, 127 and 137 in node 105, $I_1$ and $I_2$ (equation 1) depend also on the transfer properties of transistors $M_3$ and $M_4$.

A person of skill in the art is able to implement VIC 100 by selecting parameters $H_{31}$ of $M_1$ and $H_{32}$ of $M_2$ and parameters $H_{13}$ of $M_3$ and $H_{14}$ of $M_4$ such, that equation (8) is substantially fulfilled. VIC 100 does not require any current mirror as in some prior art solutions. Currents $I_1$ and $I_2$ are controlled without adapting a bias voltage of $M_1$ or $M_2$, respectively. It is an advantage of the present invention, that current $I_{34}$ is limited by the serial connection of transistors $M_3$ and $M_4$ to the smallest current flowing either through transistor $M_3$ or through transistor $M_4$. This small current contributes to achieving (a), (b) and (c) high speed, high SNR and efficiency.

VIC 100 as shown in FIG. 1, still has a disadvantage relating to common mode output changes $I_{out\ 1}$ and $I_{out\ 2}$ acting on the inputs. This disadvantage is mitigated by splitting third path 137 into two paths as illustrated in FIG. 2.

Figure 2:
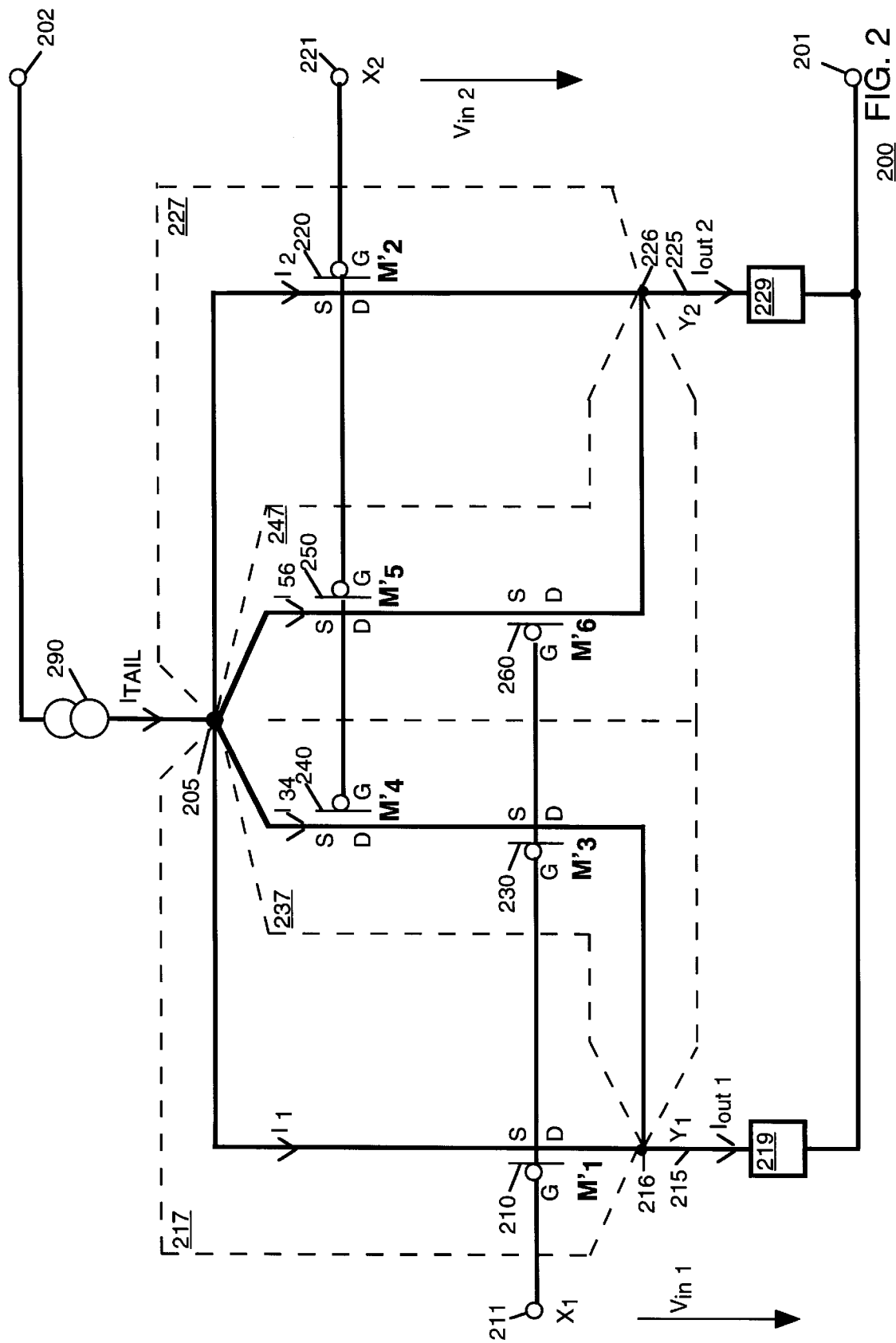
FIG. 2 is a simplified circuit diagram of a further embodiment of the present invention.

FIG. 2 is a simplified circuit diagram of VIC 200 of a further embodiment of the present invention. VIC 200 comprises transistors 210 (hereinafter $M'_1$), 220 ($M'_2$), 230 ($M'_3$), 240 ($M'_4$), 250 ($M'_5$), and 260 ($M'_6$); current source 290 and tail node 205. Reference numbers 101/201, 102/202, 105/205, 110/210, 111/211, 115/215, 117/127, 120/220, 121/221, 125/225, 127/227, 130/230, 140/240, and 190/290 in FIGS. 1–2 refer to analogous elements, whose function can be, however, different. Compared to VIC 100 of FIG. 1, transistors $M'_3$ and $M'_6$ are analogous to transistor $M_3$; and $M'_4$ and $M'_5$ are analogous to transistor $M_4$. In other words, compensation circuit 137 of VIC 100 is cut into two paths 237 and 247 (third and fourth paths with dashed frames). Path 237 has serially arranged $M'_3$ and $M'_4$ and path 247 has serially arranged $M'_5$ and $M'_6$. Paths 237 and 247 are in parallel and coupled to path 217 and 227, respectively. Transistors $M'_1$ to $M'_6$ are, preferably p-channel FETs.

VIC 200 receives differential input signal $X=X_1-X_2$, that is ($V_{in\ 1}-V_{in\ 2}$), at input terminals 211 and 221, respectively. VIC 200 provides differential output signal $Y=Y_1-Y_2$, that is ($I_{out\ 1}-I_{out\ 2}$), on lines 215 and 225 (output nodes 216 and 226), respectively.

Current source 290 is coupled to node 205 and thereby coupled to the sources S of $M'_1$, $M'_4$, $M'_5$, and $M'_2$. The drain D of $M'_1$ is coupled to node 216 and line 215; and the drain D of $M'_2$ is coupled to node 226 and line 225. The drain D of $M'_4$ is coupled to the source S of $M'_3$. The drain D of $M'_3$ is coupled to node 216 and line 215. The drain D of $M'_5$ is coupled to the source S of $M'_6$. The drain of $M'_6$ is coupled to node 226 and line 225. Input terminal 211 is coupled to gate electrodes G of $M'_1$, $M'_3$, and $M'_6$; and input terminal 221 is coupled to gate electrodes G of $M'_2$, $M'_5$, and $M'_4$. The order by which transistors $M'_4$, $M'_3$ and $M'_5$, $M'_6$ are serially coupled is convenient, but not essential. A person of skill in the art can, for example, have $M'_4$ and $M'_5$ arranged on nodes 216, 226 and $M'_3$ and $M'_6$ arranged at node 205 without departing from scope and spirit of the present invention. A still further embodiment of VIC 200 is illustrated as VIC 300 in FIG. 3 with a cross-coupled transistor arrangement.

Current source 290 provides substantially constant tail current $I_{TAIL}$ which at node 205 is split into $I_1$ of first path 217 carried by $M'_1$, $I_2$ of second path 227 carried by $M'_2$, $I_{34}$ of third path 237 carried by $M'_4$ and $M'_3$, and $I_{56}$ of fourth path 247 carried by $M'_5$ and $M'_6$:

$$I_{TAIL}=I_1+I_2+I_{34}+I_{56}\approx\text{constant} \quad (11)$$

Equation (10) is similar to equation (1). On lines 215 and 225, output currents are summed up as:

$$I_{out\ 1}=I_1+I_{34} \text{ and} \quad (12)$$

$$I_{out\ 2}=I_2+I_{56} \quad (13)$$

Transistors $M'_1$, $M'_3$, and $M'_6$ are controlled at their gate electrodes G by $V_{in\ 1}$; and, similarly, transistors $M'_2$, $M'_5$, and $M'_4$ are being controlled by $V_{in\ 2}$.

With an arrangement as in VIC 200 of FIG. 2, path 237 compensates nonlinearities of $M'_1$ in first path 217 and, independently, path 247 compensates nonlinearities of $M'_2$ in second path 227. In other words, a compensation current $I_{34}$ of VIC 100 (FIG. 1) is in VIC 200 supplied in substantially equal magnitudes as $I_{34}$ and $I_{56}$. Preferably, currents $I_{34}$ and $I_{56}$ have substantially equal magnitudes for equal input signals $V_{in\ 1}=V_{in\ 2}$. A person of skill in the art is able to apply equations similar to equations (1) to (10) to select transistors $M'_3$, $M'_4$, $M'_5$ and $M'_6$.

As an advantage of the present invention, VICs 100 and 200 have substantially the same fast operation speed as an uncompensated differential transistor pair. The compensation circuit (e.g., $M'_3$, $M'_4$, $M'_5$, $M'_6$ in VIC 200) does not comprise inverting stages which add propagation delays. Compensation signals are not subtracted as in some prior art solutions (e.g., in [1]). Instead, the supply currents $I_1$ and $I_2$ for amplifying elements are modified by subtracting a compensation current (e.g., $I_{34}$ in VIC 100, $I_{34}$ and $I_{56}$ in VIC 200). As explained later, the SNR is high.

Figure 3:
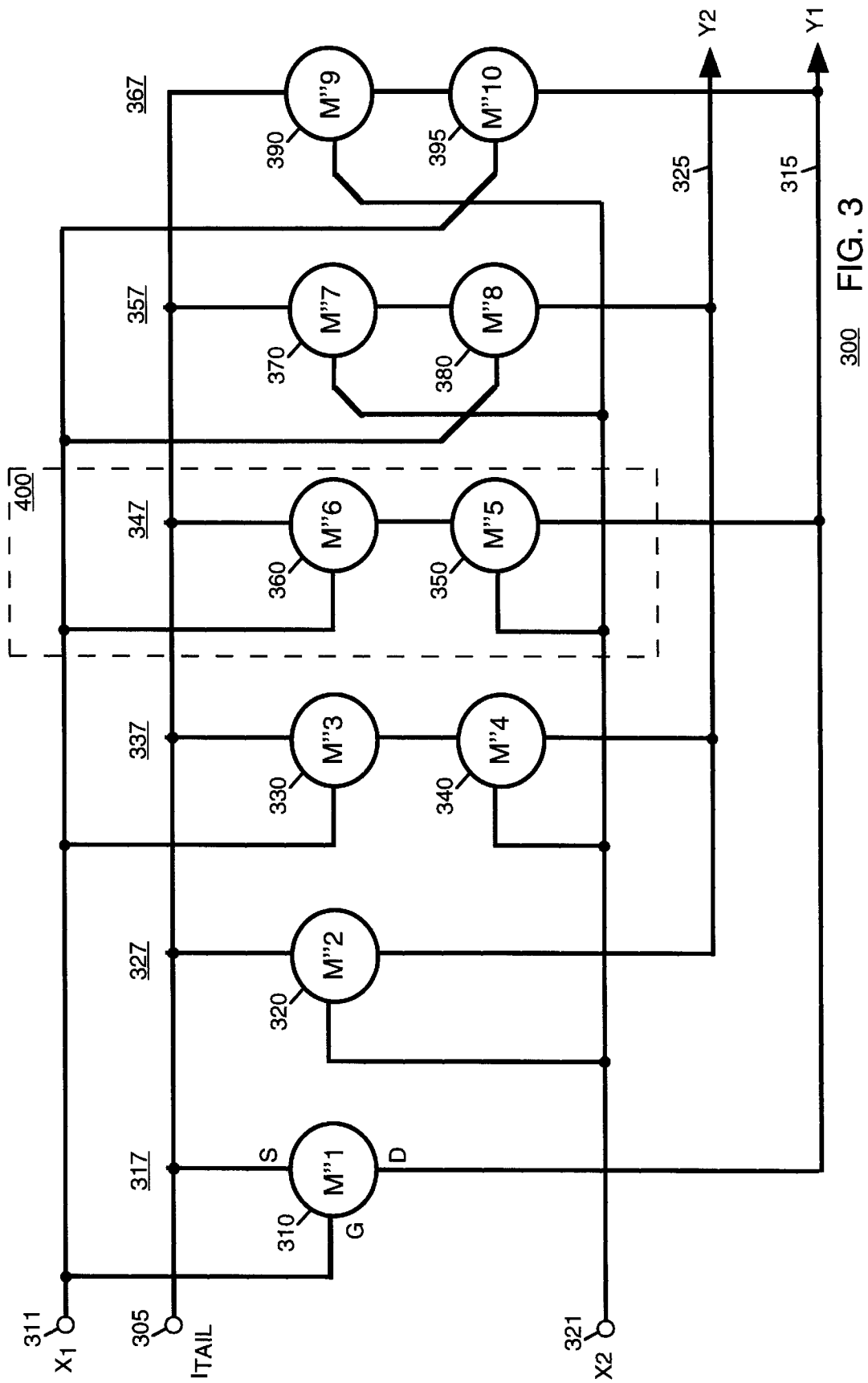
FIG. 3 is a simplified circuit diagram of a still further embodiment of the present invention.

FIG. 3 is a simplified circuit diagram of VIC 300 according to a still further embodiment of the present invention. VIC 300 comprises transistors 310 (hereinafter $M''_1$), 320 ($M''_2$), 330 ($M''_3$), 340 ($M''_4$), 350 ($M''_5$), 360 ($M''_6$), 370 ($M''_7$), 380 ($M''_8$), 390 ($M''_9$), and 395 ($M''_{10}$) (collectively $M''_k$). For simplicity, transistors $M''_k$ are illustrated by circles. Conveniently, transistors $M''_k$ are p-channel FETs with source (S), drain (D) and gate (G) as indicated at $M''_1$. Reference numbers 205/305, 210/310, 211/311, 215/315, 217/317, 220/320, 221/321, 225/325, 227/327, 230/330, 237/337, 240/340, and 247/347 in FIGS. 2–3 refer to analogous elements, whose function can be, however, different. For simplicity, current source, loads and reference terminals are omitted. Terminal 305 corresponds to node 205 and receives tail current $I_{TAIL}$. VIC 300 receives input signal $X_1$ at input terminal 311 and input signal $X_2$ at input terminal 321. VIC 300 provides output signal $Y_1$ on line 315 and output signal $Y_2$ on line 325.

$M''_1$ is coupled with its source (S) and drain (D) between terminal 305 and line 315 and receives $X_1$ from input terminal 311 at its gate (G). $M''_2$ is coupled with its S and D between terminal 305 and line 325 and receives $X_2$ from input terminal 321 at its gate G. $M''_3$ and $M''_4$ are serially coupled with their sources (Ss) and drains (Ds) between terminal 305 and line 325. The gate G of $M''_3$ receives $X_1$ from terminal 311 and the gate G of $M''_4$ receives $X_2$ from terminal 321. $M''_6$ and $M''_5$ are serially coupled with their Ss and Ds between terminal 305 and line 315. The gate G of $M''_6$ receives $X_1$ from terminal 311 and the gate G of $M''_5$ receives $X_2$ from terminal 321. $M''_7$ and $M''_8$ are serially coupled with their Ss and Ds between terminal 305 and line 325. The gate G of $M''_7$ receives $X_2$ from terminal 321 and the gate G of $M''_8$ receives $X_1$ from terminal 311. $M''_9$ and $M''_{10}$ are serially coupled with their Ss and Ds between terminal 305 and line 315. The gate G of $M''_9$ receives $X_2$ from terminal 321 and the gate G of $M_{10}''$ receives $X_1$ from terminal 311.

$M''_1$ and $M''_2$ form amplifying paths 317 and 327, respectively and provide $Y_1$ and $Y_2$, respectively. $M''_3$ and $M''_4$ form compensating path 337 for $Y_2$; $M''_6$ and $M''_5$ form compensating path 347 for $Y_1$; $M''_7$ and $M''_8$ form compensating path 357 for $Y_2$; and $M''_9$ and $M''_{10}$ form compensating path 367 for $Y_1$. In compensating paths 337 and 357, $M''_3$ and $M''_8$ receiving $X_1$ and $M''_4$ and $M''_7$ receiving $X_2$ are arranged in a different order. In other words, the connection between gates in compensation path 337 and input terminals 311 and 321 go to the nearest (or "neighboring") input terminal. In compensation path 357, the gate connections are cross-coupled. Similarly, in compensation path 347, $M''_6$ receiving $X_1$ is coupled to terminal 311 and $M''_5$ receiving $X_2$ is coupled to terminal 321, while in compensation path 367, $M''_{10}$ receiving $X_1$ and $M''_9$ are coupled in an opposite sense.

It is possible to further modify VIC 300 of the present invention by adding more transistors to any of paths 317, 327, 337, 347, 357, and 367. For convenience, path 347 and the lines to terminals 305, 311, 321 and line 315 are partly enclosed by a dashed frame to define portion 400. Portion 400 is an representative example which is not intended to be limiting. For example, portion 400 could also comprise line 325.

Figure 4:
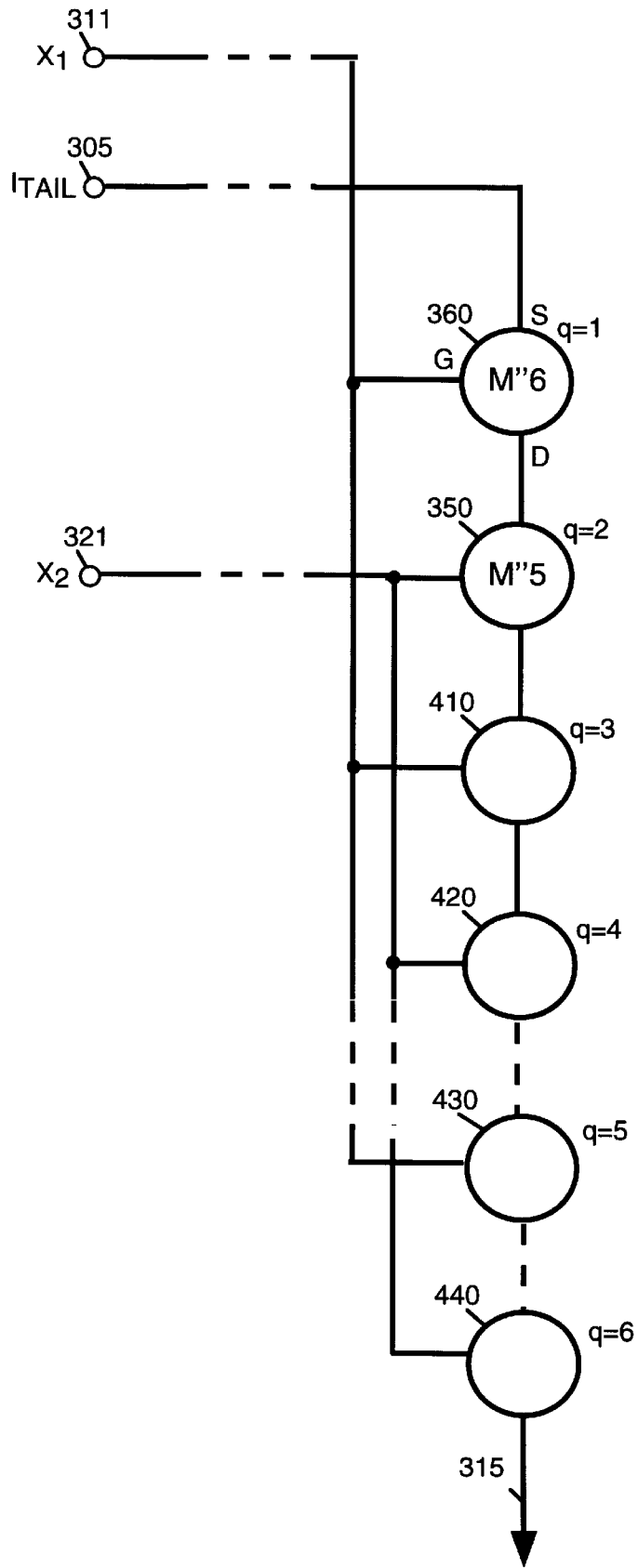
FIG. 4 is a simplified circuit diagram with further detail for a portion of the circuit of FIG. 3.

FIG. 4 is a simplified circuit diagram with further detail for portion 400 of circuit 300. Reference numbers 311, 305, 321, 315, 350 and 360 refer to analogous elements in FIGS. 3–4. In portion 400, transistors M"6 (360) and transistors M"5 (350) are serially coupled with their sources (S) and drains (D) to additional transistors 410, 420, 430, and 440 to form a transistor chain. Dashed connection lines indicate that the number of additional transistors can be higher. The gates (G) of transistors 360, 410 and 430 are coupled to terminal 311 for receiving $X_1$, and the gates (G) of transistors 350, 420 and 440 are coupled to terminal 321 for receiving $X_2$. In other words, circuit 300 has a compensation circuit with further transistors 410, 420, 430, 440, etc. ("amplifying elements") which are serially coupled to the common supply (e.g., $I_{TAIL}$ at terminal 305) and which alternatively receive input signals (e.g., $X_1$ and $X_2$). For convenience, transistors 360, 350, 410, 420, 430, and 440 are identified by indices q=1 to q=Q=6, respectively. Q can be any integer number and is, preferably even. Transistors q with odd index q (e.g., q=1, 3, 5, etc.) receive input signal $X_1$ and transistors with even index (e.g., q=2, 4, 6, etc.) receive input signal $X_2$.

A method of the present invention for compensating nonlinearities in the transfer function $H=(Y_1 -Y_2)/(X_1 -X_2)$ (cf. equation 3) of transistor 210 and transistor 220 has the following steps: (a) providing transistors 240 and 230 serially arranged with main electrodes (e.g., sources, drains) between common node 205 and output node 216 and providing transistors 250 and 260 serially arranged between common node 205 and output node 226; and (b) coupling control electrodes (e.g., gates) of transistors 230 and 260 for receiving $X_1$ and coupling control electrodes (e.g., gates) of transistors 240 and 250 for receiving $X_2$, so that (a) transistors 240 and 230 consume current $I_{34}$ from common node 205 and change current $I_1$, thereby compensating nonlinearities in transistor 210, and so that (b) transistors 250 and 260 change current $I_2$, thereby compensating nonlinearities in transistor 220.

To evaluate the present invention, the operation of VIC 300 and of an earlier design of a differential transistor pair have been simulated. The earlier design corresponds to transistor pair 110 and 120 in FIG. 3 of [1] without any compensation circuitry.

The simulation method was SPICE, but other methods known in the art could also be used to obtain equivalent results. During simulation, a differential input voltage $X=(V_{in\;1} -V_{in\;2})$ having a base frequency $f_1$ of 3 kHz (kilo hertz) was applied to VIC 300 and to the earlier design. This frequency was choosen for convenience, but other frequencies (in the MHz range or even higher) could also be used instead. The obtained differential output current $Y=(I_{out\;1} - I_{out\;2})$ was then Fourier analyzed. The resulting spectrum $$Y(0), Y(1), Y(2), Y(i), \ldots Y(10) \tag{14}$$

had components of $Y(i)=$for frequencies $f=f_1 * i$. For calculating THD, direct current component $Y(0)$ and linear component $Y(1)$ are not considered. The other components $Y(i)$ (i=1 to 10) were normalized in reference to $Y(0)$ as:

$$\underline{Y}(i)=Y(i)/Y(0) \tag{15}$$

with the underscoring of Y indicating the normalization. THD was calculated according to:

$$THD=100\% *[(\underline{Y}(2)^2+(\underline{y}(3)^2+(\underline{y}(4)^2+(\underline{y}(5)^2+\ldots\;]^{1/2} \tag{16}$$

with the superscript 2 for square operation and the superscript ½ for square root operation.

VIC 300 had THD=0.1% and the earlier design had THD=1%, thus giving VIC 300 of the present invention a 10 times better noise suppression performance than earlier design provided.

While the invention has been described in terms of particular structures, devices and materials, those of skill in the art will understand based on the description herein that it is not limited merely to such examples and that the full scope of the invention is properly determined by the claims that follow.

We claim:

1. A circuit, comprising:
    a first path with a first amplifying element for receiving a first input signal and receiving a first current $I_1$ and providing a first output signal;
    a second path with a second amplifying element for receiving a second input signal and receiving a second current $I_2$ and providing a second output signal, said first path and said second path being coupled to a common supply providing a tail current $I_{TAIL}=I_1+I_2$; and
    a compensation circuit having a third amplifying element and a fourth amplifying element serially coupled to said common supply without a current mirror, said third amplifying element receiving said first input signal and said fourth amplifying element receiving said second input signal, thereby modifying said common supply by subtracting a compensation current $I_{34}$ from said tail current $I_{TAIL}$ so that a first difference between said first output signal and said second output signal is substantially linearly related to second difference between said first input signal and second input signal.

2. The circuit of claim 1 wherein said compensation circuit is split into further paths, one path coupled to said first amplifying element and another coupled to said second amplifying element.

3. The circuit of claim 1 wherein said first, second, third, and fourth amplifying elements are p-channel field effect transistors having a source coupled to said common supply, a drain coupled to a reference terminal and a gate receiving said first or second input signals.

4. The circuit of claim 1 further comprising further amplifying elements, wherein two further amplifying elements are serially coupled in parallel to said first amplifying element and coupled to said second amplifying element, said further amplifying elements receiving said first and second input signals.

5. The circuit of claim 1 wherein said compensation circuit is coupled to a reference terminal.

6. The circuit of claim 1 wherein said compensation circuit comprises third and fourth paths and wherein said third path is coupled in parallel to said first amplifying element and wherein said fourth path is coupled in parallel to said second amplifying element.

7. The circuit of claim 1 wherein said third and fourth amplifying elements have parameters which substantially cancel nonlinear parameters in said first and second amplifying elements.

8. The circuit of claim 1 further comprising further paths, each further path having further amplifying elements which are coupled in parallel to said first path and in parallel to said second path, said further amplifying elements having control electrodes receiving said first and second input signals from neighboring terminals.

9. The circuit of claim 1 further comprising further paths, each further path having further amplifying elements which are coupled in parallel to said first path and in parallel to said second path, said further amplifying elements having control electrodes cross coupled to first and second input terminals for receiving said second and first input signals, respectively.

10. The circuit of claim 1 wherein said compensation circuit further comprises further amplifying elements serially coupled to said common supply and alternatively receiving said first input signal and said second input signal.

11. The circuit of claim 1 wherein said compensation circuit further comprises Q amplifying elements indentified by index q, wherein amplifying elements with even q receive either of said first input signal or said second input signal and wherein amplifying elements with odd q receive the other input signal.

12. An electrical apparatus receiving a differential input voltage ($V_{in\ 1} - V_{in\ 2}$) and providing a differential output current ($I_{out\ 1} - I_{out\ 2}$), said apparatus comprising:

a current source providing a substantially constant current $I_{TAIL}$ to a tail node where $I_{TAIL}$ is split into a current $I_1$, a current $I_2$, a current $I_{34}$ and a current $I_{56}$;

a first output node providing $I_{out\ 1} = I_1 + I_{34}$;

a second output node providing $I_{out\ 2} = I_2 + I_{56}$;

a first transistor coupled between said tail node and said first output node, said first transistor carrying $I_1$ and being controlled by $V_{in\ 1}$;

a second transistor coupled between said tail node and said second output node, said second transistor carrying $I_2$ and being controlled by $V_{in\ 2}$;

a third transistor and a fourth transistor serially coupled between said tail node and said first output node, said third and fourth transistors carrying $I_{34}$, said third transistor being controlled by $V_{in\ 1}$ and said fourth transistor being controlled by $V_{in\ 2}$; and a fifth transistor and a sixth transistor serially coupled between said tail node and said second output node, said fifth and sixth transistor carrying $I_{56}$, said fifth transistor being controlled by $V_{in\ 2}$ and said sixth transistor being controlled by $V_{in\ 1}$.

13. The apparatus of claim 12 further comprising a seventh transistor and an eighth transistor serially coupled between said tail node and either said first or second output node, said seventh and eight transistors having control electrodes cross coupled for receiving said differential input voltage.

14. The apparatus of claim 12 further comprising a transistor chain of serially coupled transistors identified by indices, said transistor chain being serially coupled between said tail node and said first or second output node, in said transistor chain, transistors identified with odd indices receiving $V_{in\ 1}$ and transistors with even indices receiving $V_{in\ 2}$, or vice versa.

15. A circuit comprising:

a first path receiving a first input signal $X_1$ and a first current $I_1$ and providing first output signal $Y_1 = H_{11} * X_1 + H_{21} * X_1^3 + H_{31} * I_1$;

a second path receiving a second input signal $X_2$ and a second current $I_2$ and providing second output signal $Y_2 = H_{12} * X_2 + H_{22} * X_2^3 + H_{32} * I_2$;

a third path receiving said first input signal $X_1$ and said second input signal $X_2$ and receiving a third current $I_{34} = H_{13} * X_1 + H_{14} * X_2$; and a current source coupled to said first path, to said second path and to said third path and providing that $I_1 + I_2 + I_{34}$ is approximately constant, in said circuit, nonlinear components $H_{21} * X_1^3$ in $Y_1$ and $H_{22} * X_2^3$ in $Y_2$ being substantially canceled in $Y_1$ by $H_{31} * I_1$ and substantially canceled in $Y_2$ by $H_{32} * I_2$, respectively, when $I_1$ and $I_2$ are being changed in magnitude with $I_{34}$ being changed by $X_1$ and $X_2$, thus providing resulting output signals $Y_1$ and $Y_2$ which are substantially linear related to said input signals $X_1$ and $X_2$, respectively.

16. The circuit of claim 15 wherein said first path, said second path, and said third path each comprise transistors, and wherein $H_{13}$, and $H_{14}$ are predetermined transistor parameters of transistors of said third path.

17. A method for compensating nonlinearities in the transfer function $H = (Y_1 - Y_2)/(X_1 - X_2)$ of a first transistor and a second transistor, each transistor having first and second main electrodes and a control electrode, wherein said first main electrodes receive a first current and a second current from a common node, wherein said second main electrode of said first transistor provides $Y_1$ to a first output node, wherein said second main electrode of said second transistor provides $Y_2$ to a second output node, wherein said control electrode of said first transistor receives $X_1$, and wherein said control electrode of said second transistor receives $X_2$, said method comprising the following steps:

providing third and fourth transistors serially arranged with main electrodes between said common node and said first output node and providing fifth and sixth transistors serially arranged with main electrodes between said common node and said second output node;

coupling control electrodes of said third and fifth transistors for receiving $X_1$ and coupling control electrodes of said fourth and sixth transistors for receiving $X_2$, so that said third and fourth transistors consume a third current from said common node and change said first current, thereby compensating nonlinearities in said first transistor, and so that said fifth and sixth transistors change said second current, thereby compensating nonlinearities in said second transistor.

18. The method of claim 17 applied to field effect transistors having drains and sources as main electrodes and gates as control electrodes.

* * * * *